US008476716B2

(12) United States Patent
Anderson et al.

(10) Patent No.: US 8,476,716 B2
(45) Date of Patent: Jul. 2, 2013

(54) BAND EDGE ENGINEERED VT OFFSET DEVICE (75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/614,132

(22) Filed: Sep. 13, 2012

(65) Prior Publication Data

US 2013/0001693 A1 Jan. 3, 2013

Related U.S. Application Data (62) Division of application No. 12/342,194, filed on Dec. 23, 2008, now Pat. No. 8,294,222.

(51) Int. Cl.
*H01L 27/088* (2006.01)

(52) U.S. Cl.
USPC .......................................... 257/392; 257/616

(58) Field of Classification Search
USPC ................................................. 257/392, 616
See application file for complete search history.

(56) References Cited

U.S. PATENT DOCUMENTS

| 5,081,410 A | 1/1992 | Wood |
| 5,694,032 A | 12/1997 | Gersbach et al. |
| 5,867,013 A | 2/1999 | Yu |
| 5,981,345 A | 11/1999 | Ryum et al. |
| 6,004,137 A | 12/1999 | Crabbe et al. |
| 6,339,232 B1 | 1/2002 | Takagi |
| 6,380,590 B1 | 4/2002 | Yu |
| 6,713,779 B2 | 3/2004 | Tezuka et al. |
| 6,861,304 B2 | 3/2005 | Hisamoto et al. |
| 7,303,981 B2 * | 12/2007 | Hsu et al. ............... 438/488 |
| 7,528,044 B2 | 5/2009 | Lee |
| 8,003,467 B2 | 8/2011 | Ng et al. |

(Continued)

FOREIGN PATENT DOCUMENTS

| JP | 9266313 A | 10/1997 |
| JP | 2005109364 A | 4/2005 |

OTHER PUBLICATIONS

Y.L. Tsang et al., "Modeling of the Threshold Voltage in Strained Si/Si 1-xGex/Sil-yGey(x>y) CMOS Architactures", IEEE Transactions on Electron devices, vol. 54, No. 11, Nov. 2007, pp. 3040-3048.

(Continued)

*Primary Examiner* — Mark Prenty
(74) *Attorney, Agent, or Firm* — Anthony Canale; Roberts Mlotkowski Safran & Cole, P.C.

(57) ABSTRACT

Band edge engineered Vt offset devices, design structures for band edge engineered Vt offset devices and methods of fabricating such structures is provided herein. The structure includes a first FET having a channel of a first compound semiconductor of first atomic proportions resulting in a first band structure and a first type. The structure further includes a second FET having a channel of a second compound semiconductor of second atomic proportions resulting in a second band structure and a first type. The first compound semiconductor is different from the second compound semiconductor such that the first FET has a first band structure different from second band structure, giving rise to a threshold voltage different from that of the second FET.

17 Claims, 9 Drawing Sheets

U.S. PATENT DOCUMENTS

| | | | |
|---|---|---|---|
| 8,294,222 B2 * | 10/2012 | Anderson et al. | 257/392 |
| 2001/0045604 A1 | 11/2001 | Oda et al. | |
| 2002/0088971 A1 | 7/2002 | Tezuka et al. | |
| 2008/0001183 A1 | 1/2008 | Kapoor | |
| 2009/0039391 A1 | 2/2009 | Ochimizu et al. | |
| 2009/0187871 A1 | 7/2009 | Cork | |

OTHER PUBLICATIONS

A. Zaslavsky, "Si/SiGe Heterostructure MOS Devices with Step-Graded Bandgap Profile of the SiGe Channel", IBM Technical Disclosure Bulletin; Mar. 1993; pp. 127-130.

* cited by examiner

BAND EDGE ENGINEERED VT OFFSET DEVICE

CROSS REFERENCE TO RELATED APPLICATION

The present application is a divisional of U.S. application Ser. No. 12/342,194, filed Dec. 23, 2008, the contents of which are incorporated by reference herein in their entirety.

BACKGROUND

The invention relates to integrated circuits, and more particularly, to band edge engineered Vt offset devices, design structures for band edge engineered Vt offset devices and methods of fabricating such structures.

CMOS processing requires both NMOS and PMOS devices. In these devices, high-k/metal gate implementation requires a metal that works for NMOS (typically of workfunction between 4.2 eV and 4.6 eV) and a metal that works for PMOS (typically of workfunction between 4.8 eV and 5.2 eV). This constitutes the material requirements of two "work function" metals (properties capable of achieving $V_t$), one needed for each device. The work function metals between 4.2 eV to 4.6 eV and 4.8 to 5.2 eV are needed to adjust the $V_t$ of the NMOS and PMOS devices, respectively.

In conventional processing of CMOS, a single metal is used in the gate fabrication of the NMOS and another single metal is used for the gate fabrication of the PMOS. Also, it is known that most metals with high work function have stable bulk characteristics after high thermal processing. However, these metals alter their interface characteristics with the high-k dielectric after high-temperature processing which manifests itself as $V_t$ variation and dielectric leakage. These conditions lead to decreased device reliability.

Devices with work functions nearer to the silicon midgap energy require lower values of channel doping in order to achieve proper Vt. This to leads to difficulties in controlling Vt roll-off, that is, the rapid change in Vt with variation in gate length, thereby leading to Vt tolerance degradation, which is especially detrimental to analog circuits.

Accordingly, there exists a need in the art to overcome the deficiencies and limitations described hereinabove.

SUMMARY

In a first aspect of the invention, a structure comprises a first FET comprising a channel of a first compound semiconductor of first atomic proportions resulting in a first band structure and a first type. The structure further comprises a second FET comprising a channel of a second compound semiconductor of second atomic proportions resulting in a second band structure and a first type. The first compound semiconductor is different from the second compound semiconductor such that the first FET has a first band structure different from second band structure, giving rise to a threshold voltage different from that of the second FET.

In a second aspect of the invention, a circuit comprises a first FET comprising a first channel with a first band structure and a second FET comprising a second channel with a second band structure. The first and second FETs have identical channel doping, source, and drain structures.

In a third aspect of the invention, a design structure is embodied in a machine readable medium for designing, manufacturing, or testing an integrated circuit. The design structure comprises: a first FET comprising a channel of a first compound semiconductor of first atomic proportions resulting in a first band structure and a first type; and a second FET comprising a channel of a second compound semiconductor of second atomic proportions resulting in a second band structure and a first type. The first compound semiconductor is different from the second compound semiconductor such that the first FET has a first band structure different from second band structure, giving rise to a threshold voltage different from that of the second FET.

In a fourth aspect of the invention, a method comprises forming a first FET of a first type comprising a channel of $Si_{(1-x)}GE_x$ compound semiconductor and forming a second FET of a first type comprising a channel of $Si_{(1-y)}Ge_y$. The component x is not equal to y.

In a fifth aspect of the invention, a method comprises: protecting a first area of a substrate with a mask; growing SiGe on an unprotected area of the substrate; removing the mask; forming a first device on the protected first area; and forming a second device on the unprotected area of the substrate. The first device has a channel of $Si_{(1-x)}Ge_x$ compound semiconductor, the second FET of a first type comprising a channel of $Si_{(1-y)}Ge_y$, and x is not equal to y.

In a sixth aspect of the invention, a method of forming a device comprises: growing a first type of semiconductor compound on an exposed area of a substrate while another area is protected by a dielectric material; stripping the dielectric material from the another area of the substrate; forming a first device on the exposed area of the substrate; and forming a second device on the another area of the substrate after the stripping. A channel of the first device has a different conduction or valance band energy than the second device.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits, and more particularly, to band edge engineered Vt offset devices, design structures for band edge engineered Vt offset devices and methods of fabricating such devices. The present invention provides devices, methods of manufacturing and design structures with improved SOI device performance. More particularly, the present invention is directed to SOI devices with metal gate high-k dielectrics in which the channels of such devices have different band energies, i.e., different voltage thresholds (Vt) due to differently engineered channels. Advantageously, the output voltages of the devices formed by the processes described herein remain constant, e.g., insensitive to process variations. That is, in accordance with aspects of the invention it is now possible to predict output voltages, independent of the process variations. Also, the devices are formed simultaneously with simplified processing thus improving yield of the devices. Additionally, the present invention provides reduced Iddq (high Vt PFET), amongst other features.

In embodiments, the present invention can be implemented with SRAM cell PFETs or NFETs manufactured on a same substrate. More specifically, in embodiments, the present invention includes a first FET of a first type and a second FET of a second type. In a preferred embodiment, the first FET comprises a channel of $Si_{(1-x)}Ge_x$ compound semiconductor and the second FET comprises a channel of $Si_{(1-y)}Ge_y$. In embodiments, x is not equal to y. In further embodiments, x=0. In addition, the first and second FETs have different threshold voltages due to a difference in valence or valence band energies of the channel material, with these threshold voltages remaining constant regardless of processes variations. That is, the voltage output will remain constant, i.e., insensitive to any variation in processes. The first and second FETs can be SOI FETs. In further embodiments, the FETS have substantially the same channel doping, but the first FET will have a higher Vt than the second FET due to the channel compound.

In further embodiments, the device may be used in a circuit comprising a first FET and a second FET, where the first FET comprises a first channel with a first band structure and the second FET comprises a second channel with a second band structure. In this implementation, the first and second FETs have identical channel doping, source, and drain structures. The first and second FETs have differing threshold voltages, though, by virtue of the difference in band structures. Also, the first and second FETs can be implemented in a voltage reference circuit and a current reference circuit.

Figure 1:
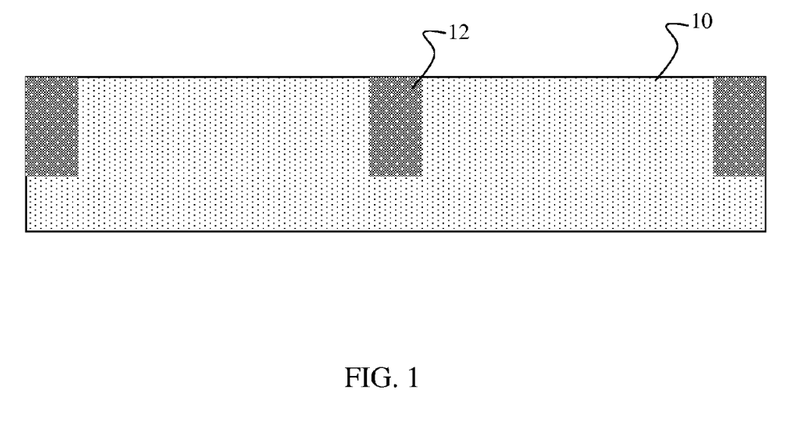
FIGS. 1-4 show structures and respective processing steps in accordance with a first aspect of the invention.

FIG. 1 shows a beginning structure and respective processing steps in accordance with a first aspect of the invention. More specifically, FIG. 1 shows a beginning structure having conventional shallow trench isolation structures (STI) 12 fabricated in a substrate 10. The substrate 10 can be, for example, a bulk wafer or SOI. In embodiments, the STI 12 are formed in a conventional manner using lithographic and etching steps (reactive ion etching (RIE)) as is known to those of skill in the art such that further explanation is not required herein for an understanding of the invention. The STI 12 may be any insulative type material known to be used in semiconductor fabrication processes such as, for example, oxide based materials. In embodiments, a top layer of the substrate 10 may contain a first fraction of Ge (or C, depending on the implemented embodiment). The fraction may be 0%, in embodiments.

Figure 2:
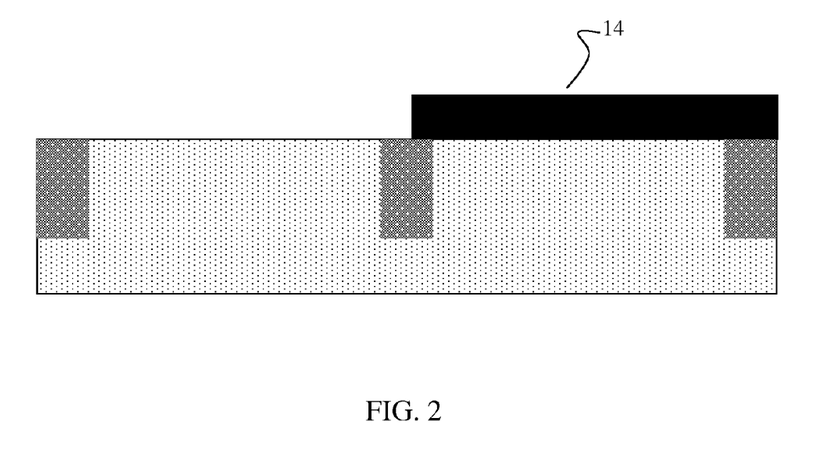

In FIG. 2, a mask 14 is deposited on the structure of FIG. 1. The mask 14 may be a dielectric material such as, for example, $SiO_2$. The dielectric material 14 is patterned in a conventional manner using lithographic and ion etching processes, for example. The dielectric material 14 can be patterned in such a manner as to expose a first area (that will eventually be fabricated into a device) and protect a second area (that will eventually be fabricated into another device).

Figure 3:
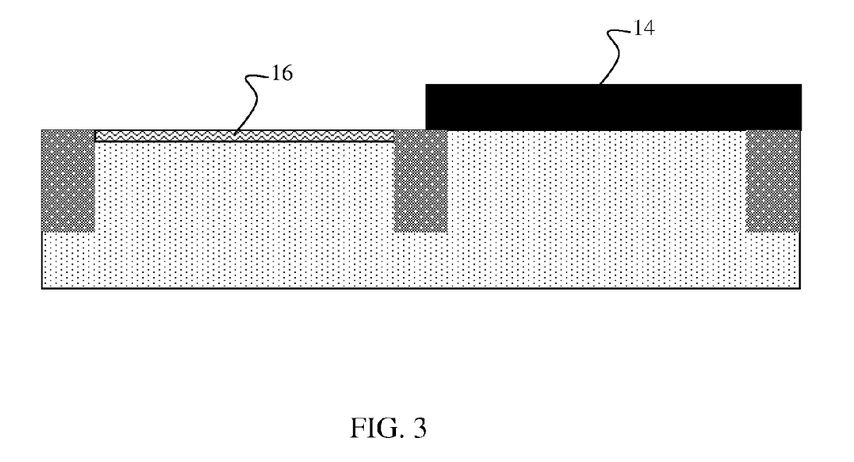

As shown in FIG. 3, a SiGe layer 16 with a second fraction of Ge is grown over the exposed area of the substrate 10. The second fraction of Ge is greater than 0%. In embodiments, the second fraction of Ge is approximately less than 5%, but can be up to 10%, in embodiments. The second fraction of Ge will provide a different valence band for the device that is formed over the SiGe layer 16, compared to a device that is formed over the area of the wafer 10 that is protected by the dielectric material 14. In further embodiments, SiC can be deposited on the exposed wafer using an ion implantation process.

Figure 4:
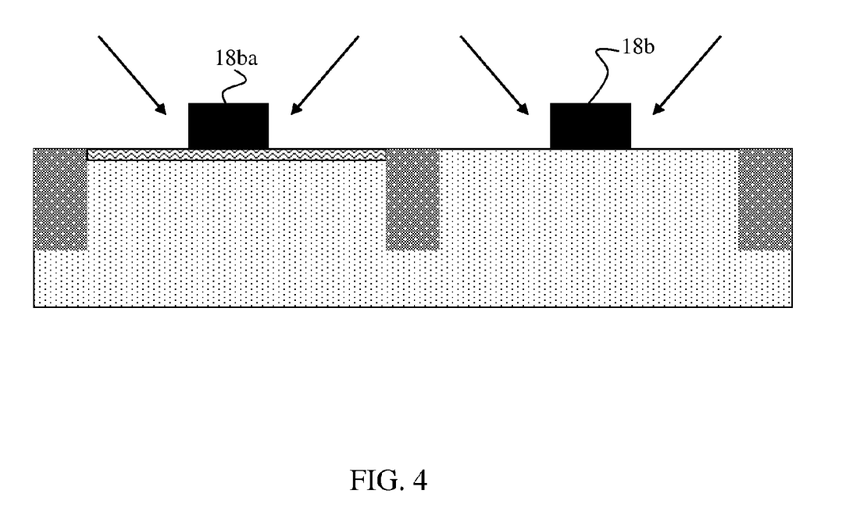

In FIG. 4, the dielectric material 14 is removed using conventional stripping processes. Thereafter, gate structures 18a and 18b are formed in a conventional manner. In embodiments, the gate structures (FETS) 18a and 18b are high-k metal gates. As an illustrative example of the formation of the gate structures 18a and 18b, a high-k dielectric, e.g., silicon oxide, hafnium oxide, etc., is deposited on the structure of FIG. 4. A thin layer of metal, e.g., about 10 to 20 nanometers, is deposited on the high-k dielectric. The metal may be, for example, a layer of TiN and/or TaN. Following the deposition of the metal layer, a doped poly with a nickel silicide and/or other typically used metals such as, for example, Al and/or TaAl, are deposited in a stacked configuration. The stacked structure can then be patterned and etched to form the gate structures (FETS) 18a and 18b. Following the patterning, source and drain regions are formed using conventional ion implantation processes as represented by the arrows of FIG. 4.

In embodiments, the device formed over the SiGe layer provides a FET with a different valence band (Vt), compared to the FET formed on the protected area. The FETs will have different threshold voltages due to a difference in valence or conduction band energies of the channel material. Advantageously, using the processes described herein, the Vt of each device will remain constant and, as such, will have improved yield, reliability and device performance. That is, the voltage output will be constant, i.e., insensitive to any variation in processes.

Figure 5:
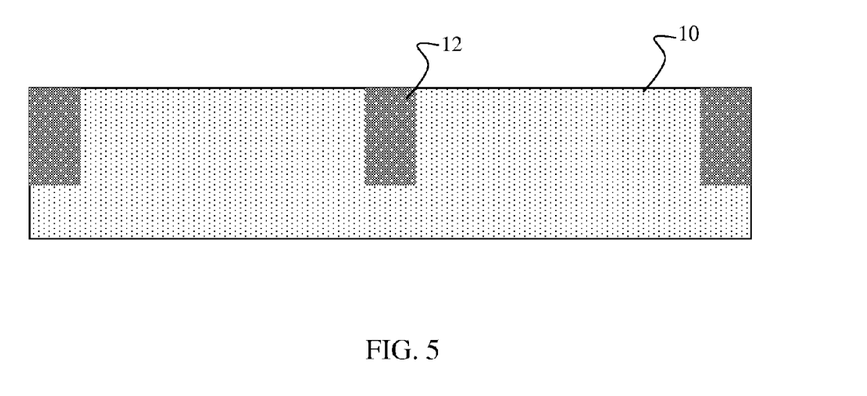
FIGS. 5-8 show structures and respective processing steps in accordance with a second aspect of the invention.

FIG. 5 shows a beginning structure and respective processing steps in accordance with a second aspect of the invention. Similar to FIG. 1, the structure of FIG. 5 shows a beginning structure having conventional shallow trench isolation structures (STI) 12 fabricated in a substrate 10. The substrate 10 can be, for example, a bulk wafer or SOI. In embodiments, the STI 12 may be any insulative type material known to be used in semiconductor fabrication processes such as, for example, oxide based materials.

Figure 6:
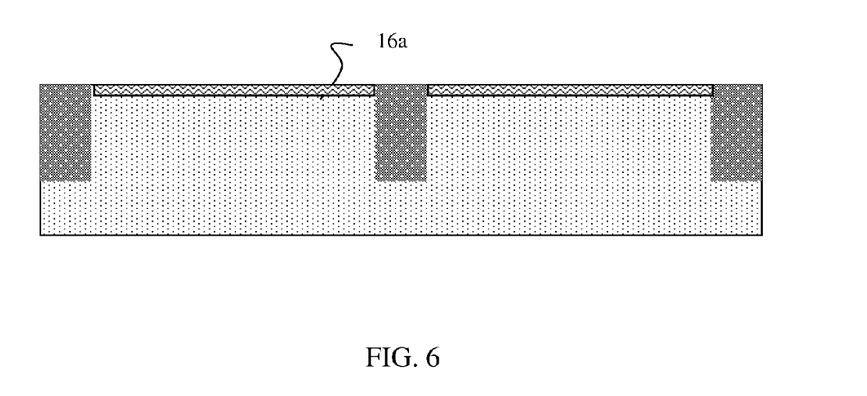

In FIG. 6, a SiGe layer 16a with a fraction of Ge is grown on the structure of FIG. 5. In embodiments, the first fraction of Ge is approximately 5% or less (but greater than 0%). In embodiments, the layer 16a may be a deposition of SiC. In the embodiment of SiC, an ion implantation can take place to dope carbon into the structure of FIG. 6.

Figure 7:
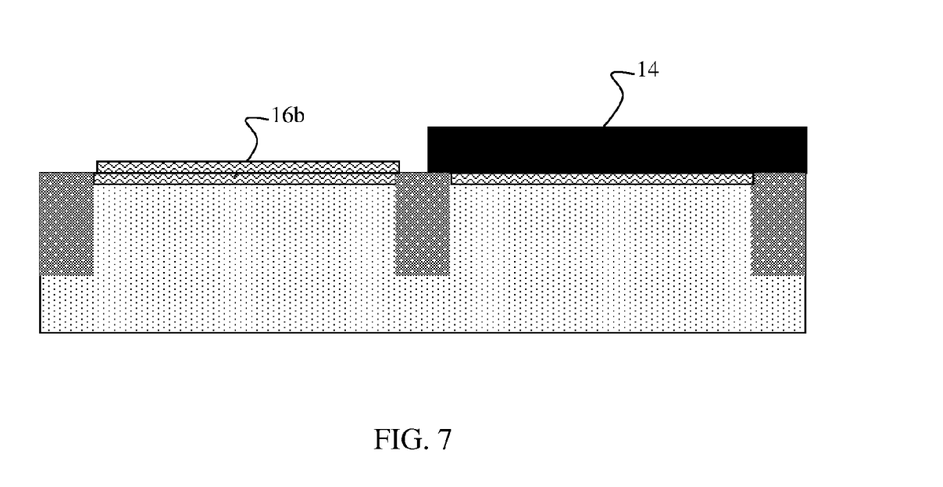

In FIG. 7, a mask 14 is deposited on the structure of FIG. 6. The mask 14 may be a dielectric material such as, for example, $SiO_2$. The dielectric material 14 is patterned in a conventional manner as discussed above to cover a portion of the structure that will eventually be fabricated into one of the devices thereon. FIG. 7 also shows a selective growth of a second SiGe layer 16b on the exposed portion of the structure, over the layer 16a. In embodiments, the layer 16b may be a deposition of SiC when the layer 16a is SiC. In either case, the fraction of Ge (or C) of the second layer 16b will be increased compared to the layer 16a, alone.

The second fraction of Ge (or C) is greater than 0%. In embodiments, the second fraction of Ge (or C) is approximately less than 5%, but can be up to 10%, in embodiments. As should be understood by those of skill in the art, the concentration of Ge (or C) will be higher on the exposed portion of the structure, compared to the protected portion of the structure. Also, the use of the higher fraction will provide a different valence band for the FET that is formed over the layer 16b, compared to a FET that is formed over the area of the wafer 10 that was protected by the dielectric material 14.

Figure 8:
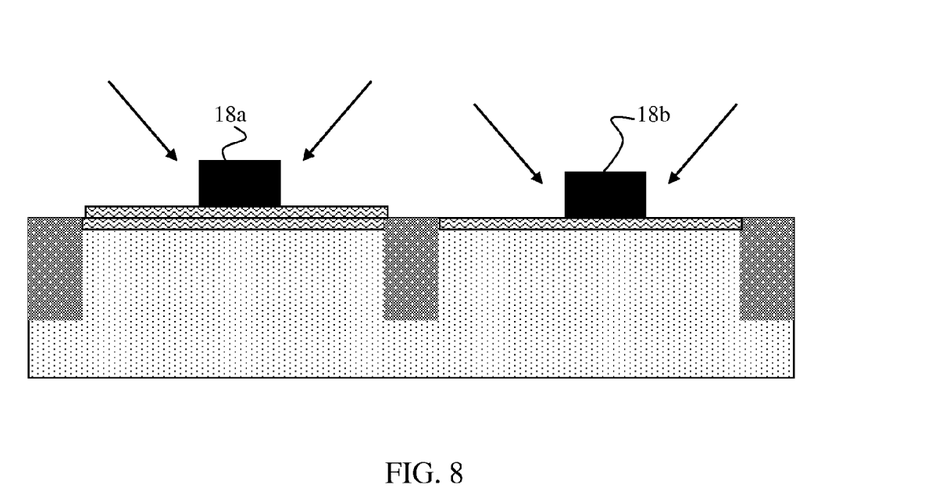

In FIG. 8, the dielectric material 14 is removed using conventional stripping processes. Thereafter, gate structures (FETS) 18a and 18b are formed in a conventional manner. In embodiments, the gate structures 18a and 18b are high-k metal gates. Similar to that described with reference to FIG. 4, a high-k dielectric e.g., silicon oxide, hafnium oxide, etc., is deposited on the structure of FIG. 8. A thin layer, e.g., about 10 to 20 nanometers, of metal, e.g., TiN and/or TaN, is deposited on the high-k dielectric. A doped poly with a nickel silicide and/or other typically used metals such as, for example, Al and/or TaAl are deposited in a stacked configuration. The stacked structure is then patterned and etched to form the gate structures (FETS) 18a and 18b. Following the patterning, source and drain regions are formed using conventional ion implantation processes as represented by the arrows of FIG. 8.

In embodiments, the device formed over the SiGe layer 16b provides a different valence band (Vt) for the FET formed thereon, compared to the FET formed only on the layer 16a. As such, the FETs will have different threshold voltages due to a difference in valence or conduction band energies of the channel material. Advantageously, using the processes described herein, the Vt of each device will remain constant and, as such, will have improved yield, reliability and device performance. That is, the voltage output will be constant, i.e., insensitive to any variation in processes.

Figure 9:
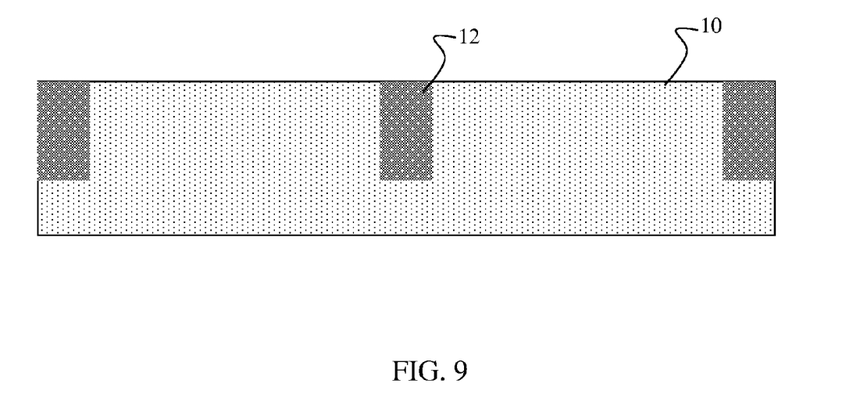
FIGS. 9-12 show structures and respective processing steps in accordance with a third aspect of the invention.

FIG. 9 shows a beginning structure and respective processing steps in accordance with a third aspect of the invention. Similar to FIG. 1, the structure of FIG. 9 shows a beginning structure having conventional shallow trench isolation structures (STI) 12 fabricated in a substrate 10. The substrate 10 can be, for example, a bulk wafer or SOL In embodiments, the STI 12 may be any insulative type material known to be used in semiconductor fabrication processes such as, for example, oxide based materials.

Figure 10:
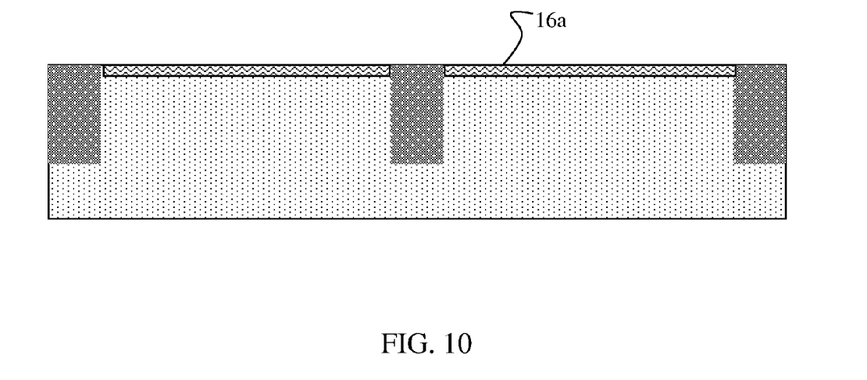

In FIG. 10, a SiGe layer 16a with a fraction of Ge is grown on the structure of FIG. 9. In embodiments, the fraction of Ge is approximately 5% or less (but greater than 0%). In embodiments, the layer 16a may be a deposition of SiC. In the embodiment of SiC, an ion implantation can take place to dope carbon into the structure of FIG. 6.

Figure 11:
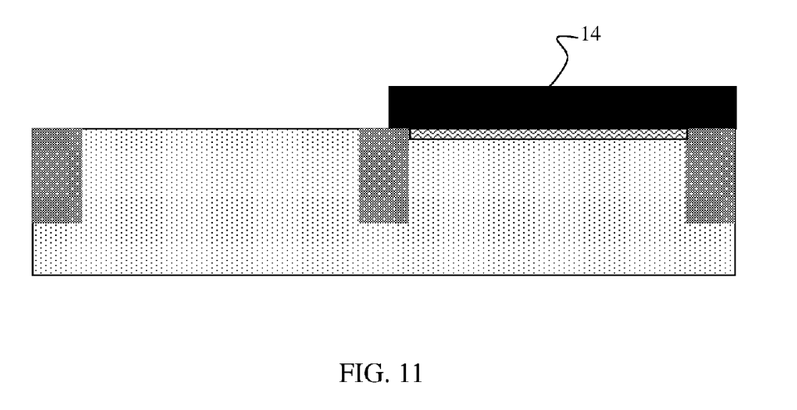

In FIG. 11, a mask 14 is deposited on the structure of FIG. 10. The mask 14 may be a dielectric material such as, for example, $SiO_2$. The dielectric material 14 is patterned in a conventional manner as discussed above to protect a portion of the structure that will eventually be fabricated into one of the devices thereon. FIG. 11 also shows an etching process to remove the exposed SiGe layer (the SiGe not protected by the dielectric material). In embodiments, the SiGe layer 16a remains on the structure, as it was protected by the dielectric material 14.

Figure 12:
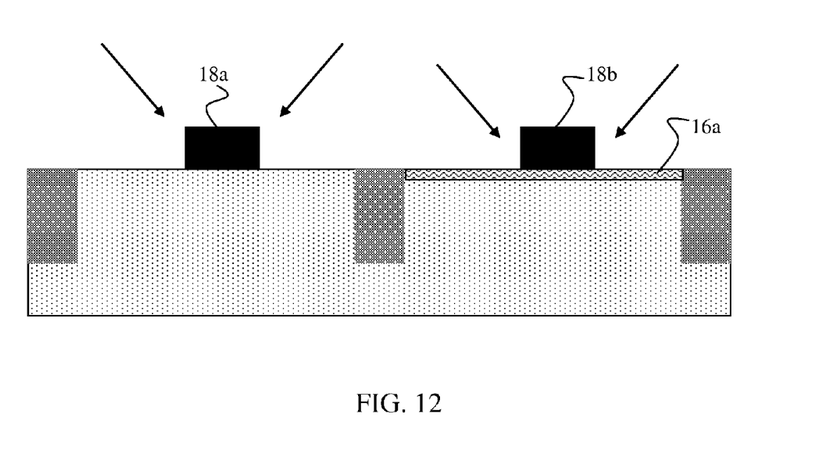

In FIG. 12, the dielectric material 14 is removed using conventional stripping processes. Thereafter, gate structures (FETs) 18a and 18b are formed in a conventional manner. In embodiments, the gate structures 18a and 18b are high-k metal gates. Similar to that of FIG. 4, a high-k dielectric, e.g., silicon oxide, hafnium oxide, etc., is deposited on the structure of FIG. 12. A thin layer, e.g., about 10 to 20 nanometers, of metal, e.g., TiN and/or TaN, is deposited on the high-k dielectric. A doped poly with a nickel silicide and/or other typically used metals such as, for example, Al and/or TaAl are deposited in a stacked configuration. The stacked structure is then patterned and etched to form the gate structures (FETs) 18a and 18b. Following the patterning, source and drain regions are formed using conventional ion implantation processes as represented by the arrows of FIG. 12.

In embodiments, the device formed over the SiGe layer provides a different valence band (Vt) for the FET formed thereon, compared to the FET formed on the exposed area (the area in which the SiGe was removed). The FETs will have different threshold voltages due to a difference in valence or conduction band energies of the channel material. Advantageously, using the processes described herein, the Vt of each device will remain constant and, as such, will provide improved yield, reliability and device performance. That is, the voltage output will be constant, i.e., insensitive to any variation in processes.

Figure 13:
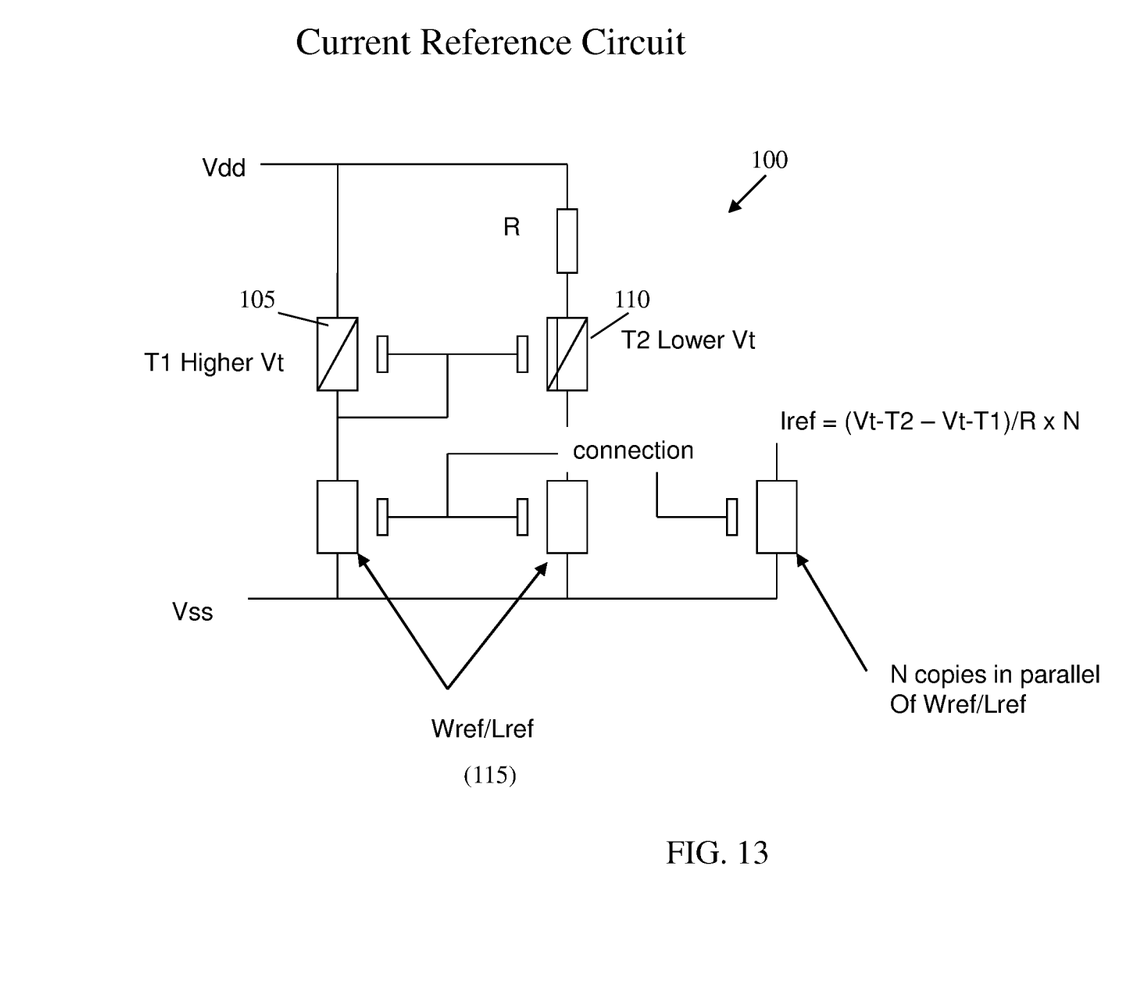
FIG. 13 shows a current reference circuit in accordance with aspects of the invention.

FIG. 13 shows a current reference circuit in accordance with aspects of the invention. The current reference circuit has a stable current with a voltage reference independent of the process variations. That is, the voltage output of the circuit will be constant, i.e., insensitive to any variation in processes.

In embodiments, FIG. 13 shows a current reference circuit 100 with a p-type FET 105 having a first Vt and a p-doped FET 110 having a second Vt. The current reference circuit also includes a current minor 115, e.g., FETs with an identical width and length. The circuit 100 additionally includes N copies in parallel of the current mirror 115. As should be understood, the FET 110 may be fabricated in accordance with any of the aspects of the invention and, as such, is identical to the FET 105 except for a fixed voltage offset by a predetermined amount, e.g., the FET 110 has a raised energy band (a lower absolute value (higher Vt)). In embodiments, the FET 105 has a Vt of −0.5 and the FET 110 has a Vt of −0.2 due to the difference in channel compound (e.g., a higher concentration of Ge in the channel than the FET 105).

Figure 14:
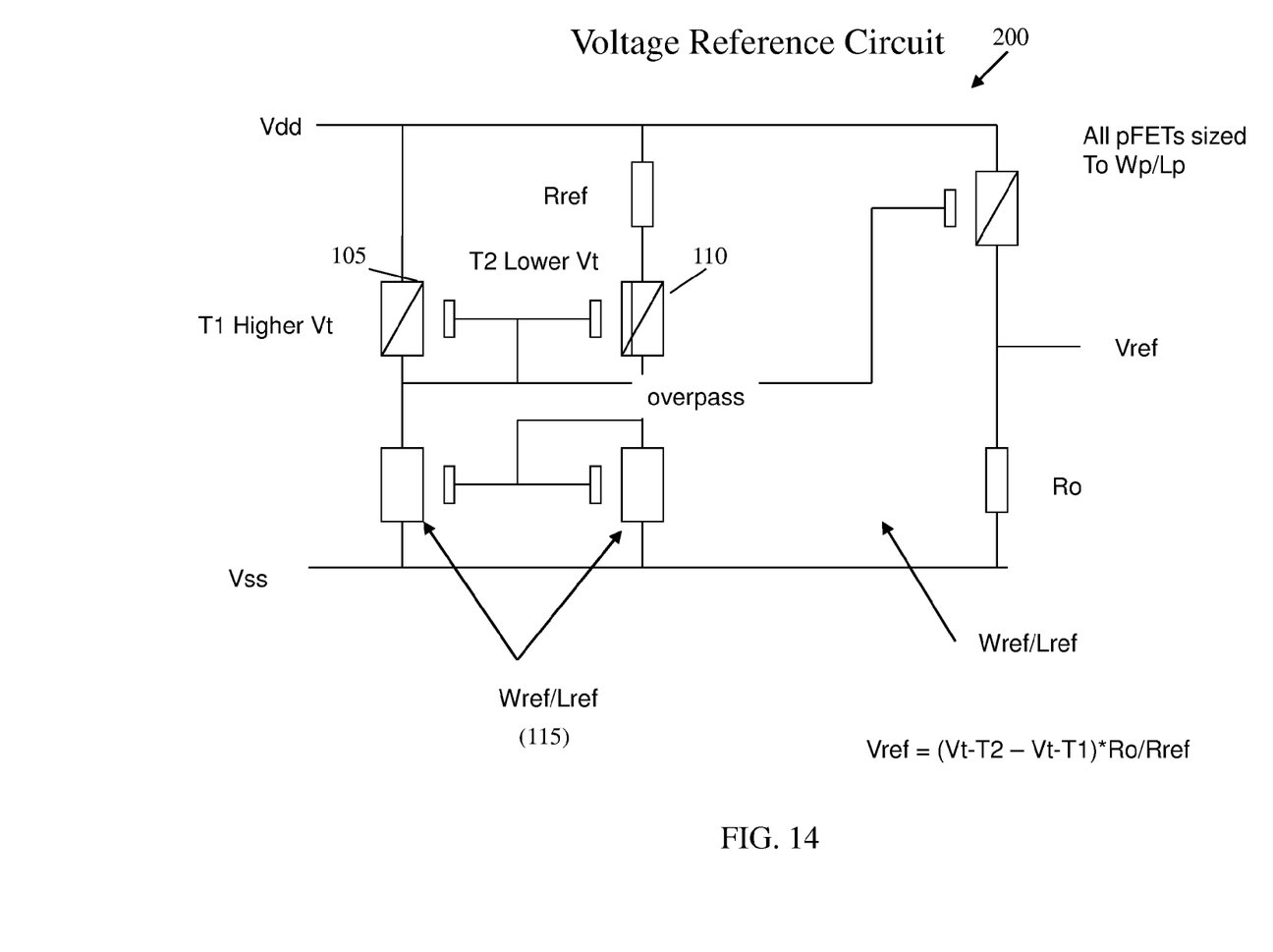
FIG. 14 shows a voltage reference circuit in accordance with aspects of the invention.

FIG. 14 shows a voltage reference circuit in accordance with aspects of the invention. In embodiments, FIG. 14 shows a voltage reference circuit 200 with a p-type FET 105 having a first Vt and a p-doped FET 110 having a second Vt. The circuit also shows a voltage reference circuit, designated Vref.

As previously discussed, the FET 110 may be fabricated in accordance with any of the aspects of the invention and, as such, is identical to the FET 105 except for a fixed voltage offset by a predetermined amount, e.g., the FET 110 has a raised energy band (a lower absolute value (higher Vt)). In embodiments, the FET 105 has a Vt of −0.5 and the second FET 110 has a Vt of −0.2 due to the difference in channel compound (e.g., a higher concentration of Ge in the channel than the FET 105).

Figure 15:
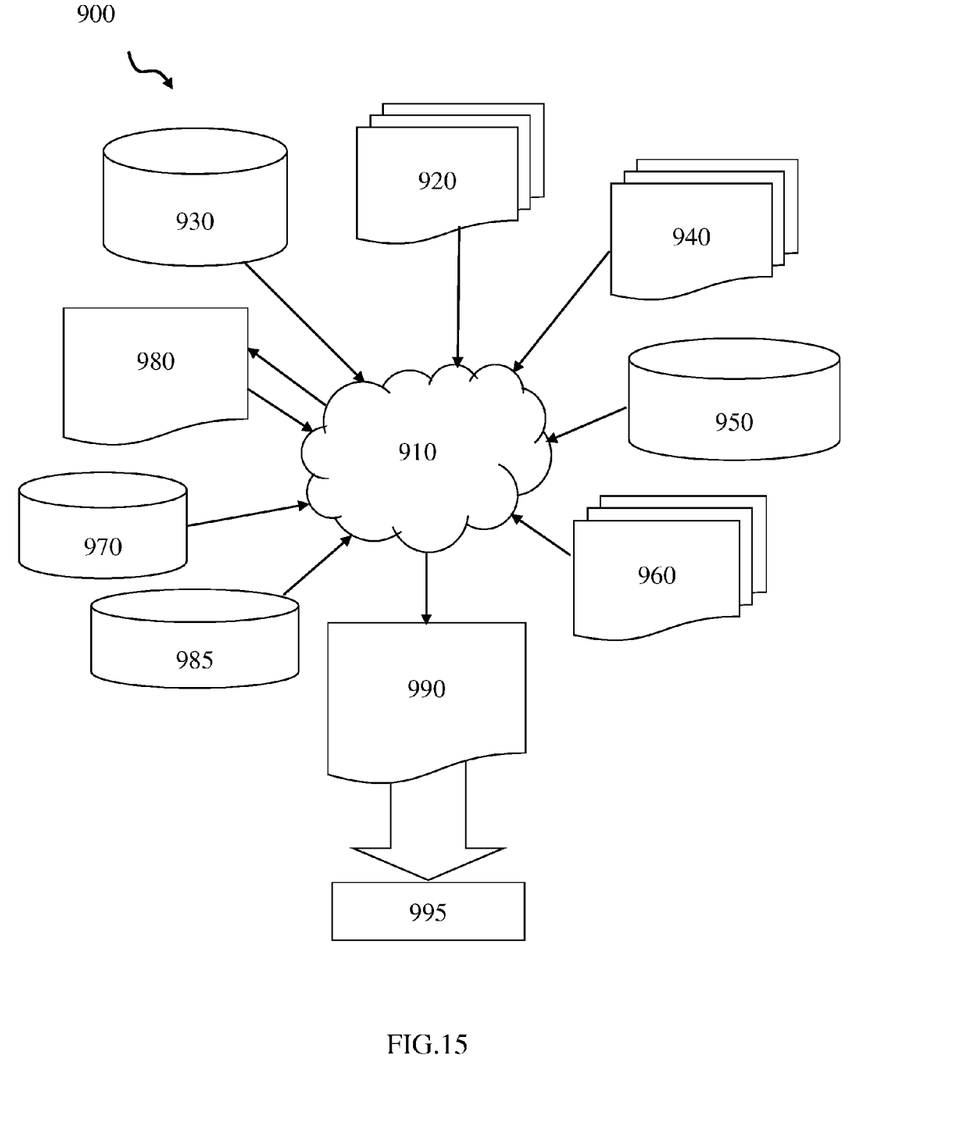
FIG. 15 is a flow diagram of a design process used in semiconductor design, manufacture, and/or test.

FIG. 15 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1-14. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 15 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-14. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-14 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-14. In one embodiment, design structure 990 may comprise a compiled, executable HDL simulation model that functionally simulates the devices shown in FIGS. 1-14.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-14. Design structure 990 may then proceed to a stage 995 where, for example, design structure 990: proceeds to tape-out, is released to manufacturing, is released to a mask house, is sent to another design house, is sent back to the customer, etc.

The methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A structure comprising:
   a first field effect transistor (FET) comprising a channel of a first compound semiconductor of first atomic proportions resulting in a first band structure and a first type; and
   a second field effect transistor (FET) comprising a channel of a second compound semiconductor of second atomic proportions resulting in a second band structure and said first type,
   wherein the first compound semiconductor is different from the second compound semiconductor such that the first FET has a first band structure different from second band structure, giving rise to a threshold voltage different from that of the second FET, and
   the first FET is disposed directly on a substrate comprising one of a bulk wafer and silicon on insulator (SOI), which comprises the channel of the first compound semiconductor.

2. The structure of claim 1, wherein:
   the first compound semiconductor comprises the substrate; and
   the second compound semiconductor comprises $Si_{(1-y)}Ge_y$.

3. The structure of claim 2, wherein the first and the second FETs have different threshold voltages due to a difference in valence band energies of channel material.

4. The structure of claim 3, wherein the first FET and the second FET are SOI FETs.

5. The structure of claim 4, wherein the first FET has channel doping substantially the same as the second FET, and has a higher Vt than the second FET.

6. A circuit, comprising:
   a first field effect transistor (FET) comprising a first channel with a first band structure comprising a first SiGe layer and a second SiGe layer on the first SiGe layer; and
   a second field effect transistor (FET) comprising a second channel with a second band structure comprising the first layer of SiGe,
   wherein the first and second FETs have identical channel doping, source, and drain structures.

7. The circuit of claim 6, wherein the first FET and the second FET have differing threshold voltages by virtue of the difference in band structures of channel material.

8. The circuit of claim 7, wherein the first FET and the second FET provide a voltage reference circuit.

9. The circuit of claim 8, wherein an output of the voltage reference circuit is insensitive to process variations.

10. The circuit of claim 8, wherein, the first FET and the second FET provide a current reference circuit.

11. The circuit of claim 10, wherein an output of the current reference circuit is insensitive to process variations.

12. The circuit of claim 6, wherein the first SiGe layer comprises $Si_{(1-x)}Ge_x$ and the second SiGe layer comprises $Si_{(1-y)}Ge_y$, wherein x is not equal to y.

13. The circuit of claim 12, wherein x>0.

14. The circuit of claim 12, wherein x<y.

15. A design structure embodied in a machine readable medium for designing, manufacturing, or testing an integrated circuit, the design structure comprising:
   a first field effect transistor (FET) comprising a channel of a first compound semiconductor of first atomic proportions resulting in a first band structure and a first type; and
   a second field effect transistor (FET) comprising a channel of a second compound semiconductor of second atomic proportions resulting in a second band structure and a first type,
   wherein the first compound semiconductor is different from the second compound semiconductor such that the first FET has a first band structure different from second band structure, giving rise to a threshold voltage different from that of the second FET, and
   the first FET is disposed directly on a substrate comprising one of a bulk wafer and silicon on insulator (SOI), which comprises the channel of the first compound semiconductor.

16. The design structure of claim 15, wherein the design structure comprises a netlist.

17. The design structure of claim 15, wherein the design structure resides on one of: storage medium as a data format used for the exchange of layout data of integrated circuits and in a programmable gate array.

* * * * *